(12) United States Patent
Scheuerlein et al.

(10) Patent No.: US 7,480,190 B1
(45) Date of Patent: Jan. 20, 2009

(54) KNOWN DEFAULT DATA STATE EPROM

(75) Inventors: Eric Scheuerlein, Los Gatos, CA (US); Donald M. Archer, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 208 days.

(21) Appl. No.: 11/359,899

(22) Filed: Feb. 21, 2006

(51) Int. Cl.
*G11C 7/10* (2006.01)

(52) U.S. Cl. .............................. 365/189.05; 365/185.22; 365/185.21

(58) Field of Classification Search ............ 365/189.05, 365/185.21, 185.22, 185.08
See application file for complete search history.

(56) References Cited

U.S. PATENT DOCUMENTS 6,185,142 B1 * 2/2001 Hotta ........................ 365/207
7,061,324 B2 * 6/2006 Diorio et al. ................ 330/277

* cited by examiner

*Primary Examiner*—Van Thu Nguyen
*Assistant Examiner*—Han Yang

(57) ABSTRACT

An embodiment of the present invention is directed to a circuit for indicating the program status of an EPROM. The circuit includes a first and second transistor coupled to a first voltage potential. The circuit further includes a latching circuit coupled to the first and second transistors. The latching circuit outputs a first output value when the current through the first transistor is greater than the current through the second transistor and a second output value when less. The circuit further includes a capacitive element coupled between a gate of the first transistor and a third voltage potential, the capacitance of the capacitive element being such that the output of the latching circuit is always a first digital state prior to programming the EPROM and a second digital state after programming the EPROM.

13 Claims, 3 Drawing Sheets

KNOWN DEFAULT DATA STATE EPROM

BACKGROUND

1. Field

The present invention generally relates to the field of semiconductor devices, and more specifically to erasable programmable read-only memories.

2. Background

An EPROM, or Erasable Programmable Read-Only Memory, is a type of memory chip that retains its data when its power supply is switched off. In other words, it is non-volatile. It is an array of floating gate transistors individually programmed by an electronic device that supplies higher voltages than those normally used in electronic circuits. Floating gate transistors commonly comprise a floating control gate isolated by a thin oxide layer. When a floating gate is given an electrical charge, that charge is trapped by the insulating thin oxide layer through a process known as Hot Electron Injection. Once programmed, a traditional EPROM can be erased only by exposing it to strong ultraviolet light through a transparent window in the top of the package. As the glass window is expensive to make, OTP (one-time programmable) chips were introduced; the only difference is that the EPROM chip is packed in an opaque package, so it cannot be erased after programming.

For a number of reasons, it may be useful for an EPROM to have an indicator as to whether it has ever been programmed. For example, a test engineer may want to know whether the current part that he or she is working on is a fresh part or whether it has been worked on. This could be because different lots may be trimmed at different locations.

Ideally, this indicator could just be a program status bit on the EPROM itself. Unfortunately, previous EPROM designs do not provide for a means of guaranteeing that the logic state of a particular bit will always be the same on every part just after fabrication but prior to programming. FIG. 1 shows a schematic for one bit of a common EPROM design. In this design, the logic state of the bit is defined by a differential between the magnitudes of two currents, $I_A$ and $I_B$. For instance, if the magnitude of $I_A$ is less than $I_B$, the bit will be logic 0 at output 120, and if $I_B$ is less than $I_A$, the bit will read logic 1 at output 120. The differential is sensed by latching circuit 110. The magnitude of each current is determined by the amount of charge on their respective floating gates, $M_A$ and $M_B$. The initial state of the bit is set by charge deposition onto these floating gates during final anneal and capacitive coupling to other nodes. Typically, this results in $I_A$ and $I_B$ being approximately equal to each other, but for slight variations due to device mismatch. Therefore, the initial state of the bit is effectively determined by the mismatch, and there is an equal possibility of the bit's unprogrammed value being logic 1 or logic 0. As such, the previous designs do not provide a means of guaranteeing that the logic state of a particular bit will always be the same after fabrication but prior to programming.

SUMMARY

An embodiment of the present invention is directed to a circuit for indicating the program status of an EPROM. The circuit includes a first and second transistor coupled to a first voltage potential. The circuit further includes a latching circuit coupled to the first and second transistors. The latching circuit outputs a first output value when the current through the first transistor is greater than the current through the second transistor and a second output value when less. The circuit further includes a capacitive element coupled between a gate of the first transistor and a third voltage potential, the capacitance of the capacitive element being such that the output of the latching circuit is always a first digital state prior to programming the EPROM and a second digital state after programming the EPROM. The first digital state indicates that the EPROM has not been programmed, and the second digital state indicates that the EPROM has been programmed.

DETAILED DESCRIPTION

Figure 1:
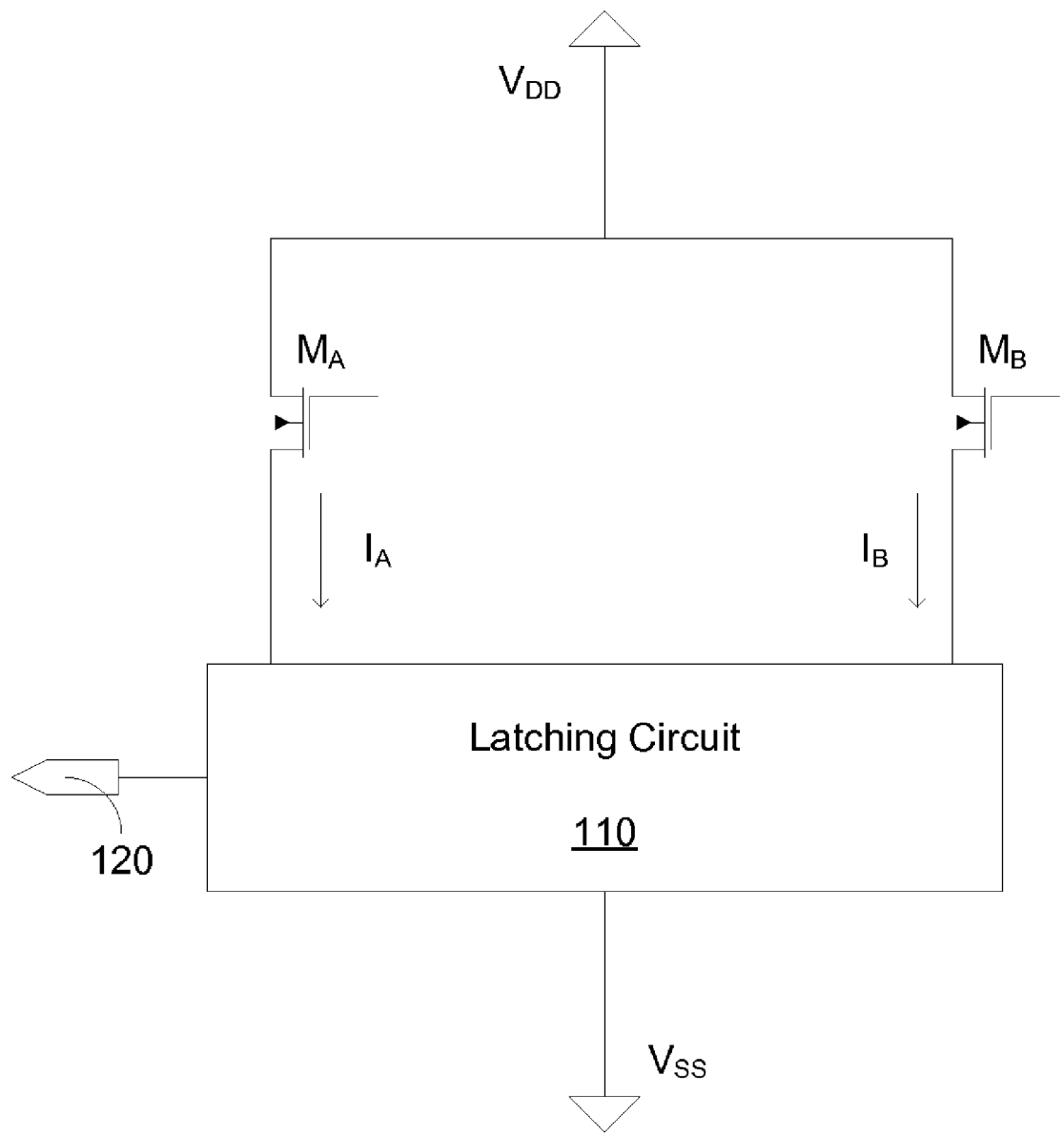
FIG. 1 shows a schematic for one bit of a common EPROM design.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Briefly stated, embodiments of the present invention are directed to a circuit and a method for guaranteeing the logic state of a program status bit of an EPROM prior to programming. Furthermore, the post-programming logic state of the program status bit will always be the opposite of its pre-programming state.

As stated above, under prior designs, there is an equal probability of a given bit's unprogrammed value of being logic 1 or logic 0. In order to guarantee the logic state of a program status bit prior to programming, circuit 100 must be modified to ensure that, for instance, $I_A$ is less than $I_B$ prior to programming and is greater than $I_B$ after programming. This needs to occur on every part with absolute certainty. In current EPROMs, $I_A \approx I_B$ before programming, and $I_A >> I_B$ after programming. Thus, it is desirable to add an offset to one or both currents such that $I_A$ is less than $I_B$ prior to programming and is greater than $I_B$ after programming. In order to understand how these offsets are to be most effectively achieved, it is necessary to understand the operating characteristics of transistors $M_A$ and $M_B$ before and after programming. Before programming, the EPROM devices are in sub-threshold and their current may be defined as:

$$I = I_S \times W/L \times e^{V_{gs}/(\zeta \times V_1)} \tag{1}$$

where $I_S$ and $\zeta$ are constants. After programming, the transistor $M_A$ is in saturation and its current may then be defined as:

$$I = k \times W/L \times (V_{gs} - V_{th})^2 \tag{2}$$

In comparing these two equations, one can see that both currents prior to programming are proportional to $e^{V_{gs}}$, while the current through $M_A$ after programming is only proportional to $V_{gs}^2$. Thus, a modification to circuit 100 that will alter the gate-source voltage of one or both of $M_A$ and $M_B$ (though primarily $M_A$) will have a more significant effect on the current before programming than it will after programming. Adding the necessary offset to Vgs can be accomplished through capacitive coupling between one or both of the floating gates and a voltage potential.

Figure 2:
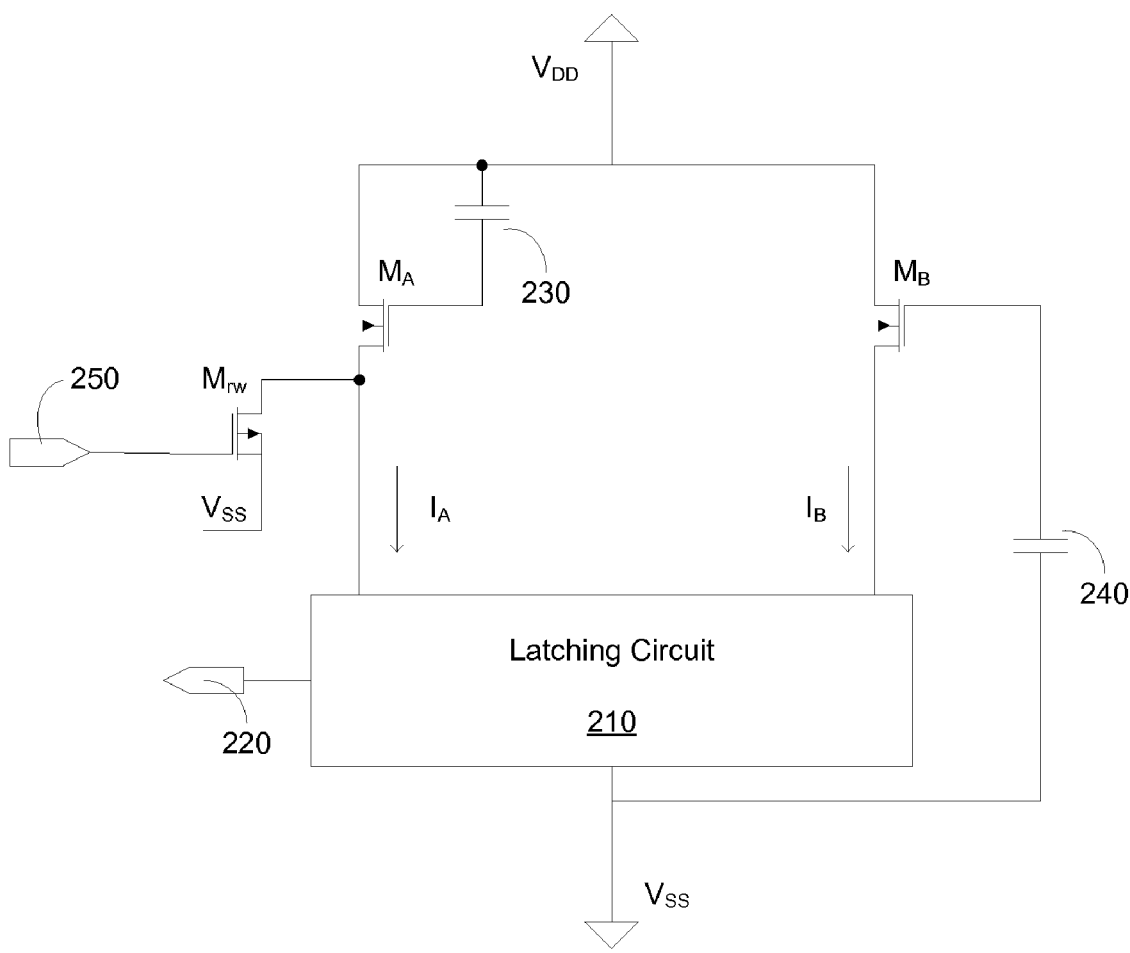
FIG. 2 shows a schematic for a program status bit of an EPROM, in accordance with an embodiment of the present invention.

FIG. 2 shows a schematic for a program status bit of an EPROM, in accordance with an embodiment of the present invention. Circuit 200 includes a first transistor $M_A$ and a second transistor $M_B$, each coupled between voltage potential $V_{DD}$ and latching circuit 210. Although PMOS transistors are depicted in FIG. 2, it shall be understood that NMOS transistors may be used instead. Latching circuit 210 senses a differential between currents $I_A$ and $I_B$. In one embodiment, latching circuit 210 will output logic 0 at output 220 if current $I_A$ is less than current $I_B$ and logic 1 if current $I_A$ is greater than current $I_B$.

In one embodiment, adding a $V_{gs}$ offset is achieved by capacitively coupling the floating gate of transistor $M_A$ to a voltage potential. In one embodiment, $M_A$ is capacitively coupled to $V_{DD}$ by capacitive element 230. It should be appreciated that although capacitive element 230 as shown in FIG. 2 is a simple capacitor, capacitive element 230 could similarly be any device that will provide capacitance between the floating gate and the voltage potential. Capacitive coupling between the floating gate of transistor $M_A$ and $V_{DD}$ will raise the gate voltage of transistor $M_A$, thereby decreasing its gate-source voltage. As a result, current $I_A$ is decreased relative to $I_B$. Coupling capacitive element 230 between $M_A$ and $V_{DD}$ ensures that current $I_A$ will always be less than current $I_B$ prior to programming, and therefore output 220 is guaranteed to be logic 0.

In one embodiment, additional offset is added to circuit 200 by capacitively coupling the floating gate of transistor $M_B$ to a voltage potential. In one embodiment, $M_B$ is capacitively coupled to $V_{SS}$ by capacitive element 240. It should be appreciated that although capacitive element 240 as shown in FIG. 2 is a simple capacitor, capacitive element 240 could similarly be any device that will provide capacitance between the floating gate and the voltage potential. Capacitive coupling between the floating gate of transistor $M_B$ and $V_{SS}$ will lower the gate voltage of transistor $M_B$, thereby increasing its gate-source voltage. As a result, current $I_B$ is increased relative to $I_A$. Coupling capacitive element 240 between $M_B$ and $V_{SS}$ ensures that current $I_B$ will always be greater than current $I_A$ prior to programming, and therefore output 220 is guaranteed to be logic 0.

In one embodiment, input 250 is set to high during programming. Input 250 controls the gate of transistor $M_{rw}$. In one embodiment, transistor $M_{rw}$ is a wide (5 micron) and short (0.6 micron) device that acts as a switch for connecting the drain of $M_A$ to $V_{SS}$. Thus, setting input 250 to high will cause the drain voltage of transistor $M_A$ to be approximately $V_{SS}$. This creates a large voltage drop across $M_A$, which in turn causes additional charge to be deposited on the floating gate of transistor $M_A$. This additional charge on the gate of transistor $M_A$ increases its gate-source voltage and consequently increases $I_A$ to become greater $I_B$. Moreover, because transistor $M_A$ is now operating in the saturation region, the capacitive coupling from capacitive elements 230 and 240 have less of an impact on the relative currents $I_A$ and $I_B$. Latching circuit 210 senses that $I_A$ is now greater than $I_B$ and changes its output 220 accordingly to be logic 1, indicating that the part has now been programmed.

Figure 3:
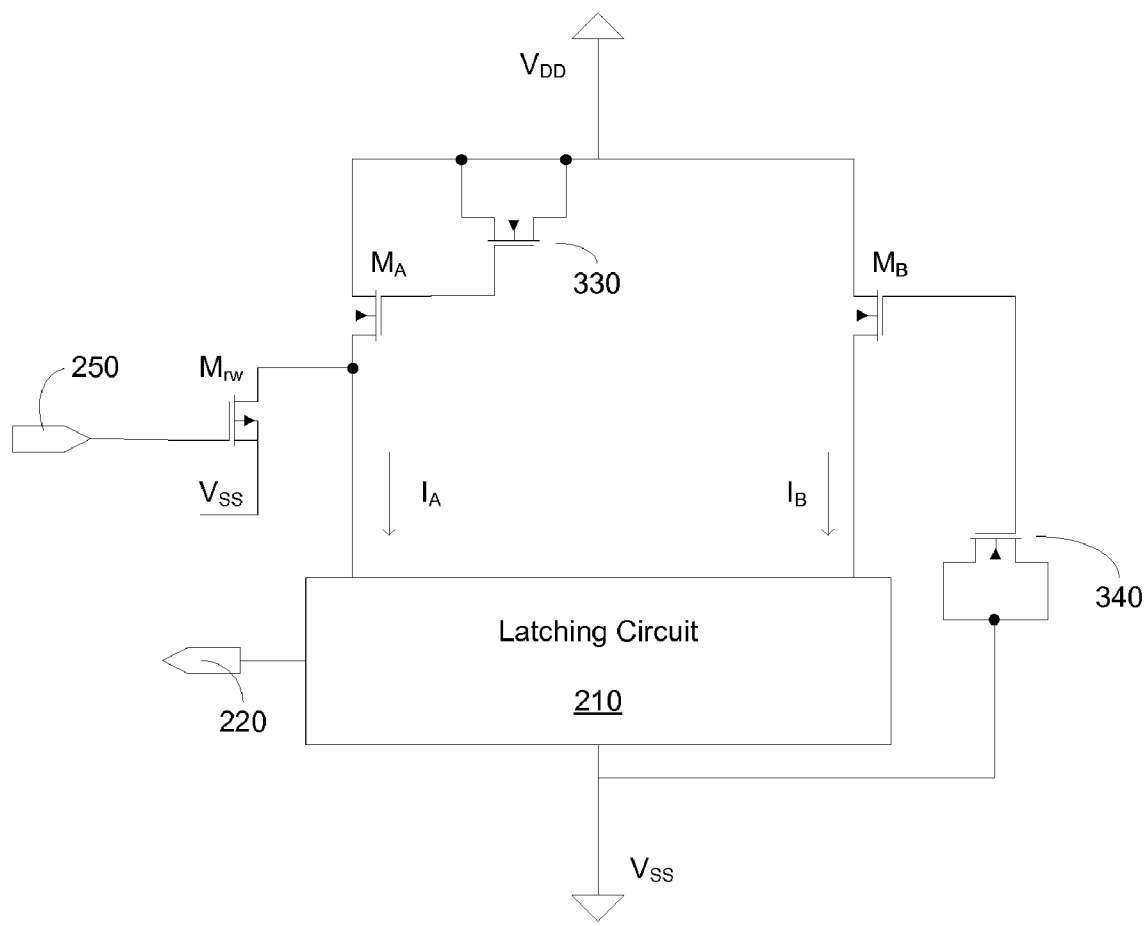
FIG. 3 shows a schematic for a program status bit of an EPROM, in accordance with a preferred embodiment of the present invention.

FIG. 3 shows a schematic for a program status bit of an EPROM, in accordance with a preferred embodiment of the present invention. Circuit 300 includes a first transistor $M_A$ and a second transistor $M_B$, each coupled between voltage potential $V_{DD}$ and latching circuit 210. Although PMOS transistors are depicted in FIG. 1, it shall be understood that NMOS transistors may be used instead. Latching circuit 210 senses a differential between currents $I_A$ and $I_B$. In a preferred embodiment, latching circuit 210 will output logic 0 at output 220 if current $I_A$ is less than current $I_B$ and logic 1 if current $I_A$ is greater than current $I_B$.

Offset is added to circuit 300 by capacitively coupling the floating gate of transistor $M_A$ to a voltage potential. In a preferred embodiment, this capacitive coupling is achieved via transistor 330. It should be appreciated that the small-signal equivalent of transistor 330, as shown in FIG. 3, is a capacitor between the gate of $M_A$ and $V_{DD}$. It should be further be appreciated that although transistor 330 as shown in FIG. 3 is a PMOS transistor, transistor 330 could similarly be an NMOS transistor. Capacitive coupling between the floating gate of transistor $M_A$ and $V_{DD}$ will raise the gate voltage of transistor $M_A$, thereby decreasing its gate-source voltage. As a result, current $I_A$ is decreased relative to $I_B$. Coupling transistor 330 between $M_A$ and $V_{DD}$ ensures that current $I_A$ will always be less than current $I_B$ prior to programming, and therefore output 220 is guaranteed to be logic 0.

In a preferred embodiment, additional offset is added to circuit 300 by capacitively coupling the floating gate of transistor $M_B$ to a voltage potential. This capacitive coupling is achieved via transistor 340. It should be appreciated that the small-signal equivalent of transistor 340, as shown in FIG. 3, is a capacitor between the gate of $M_B$ and $V_{SS}$. It should be further be appreciated that although transistor 340 as shown in FIG. 3 is a PMOS transistor, transistor 340 could similarly be an NMOS transistor. Capacitive coupling between the floating gate of transistor $M_B$ and $V_{SS}$ will lower the gate voltage of transistor $M_B$, thereby increasing its gate-source voltage. As a result, current $I_B$ is increased relative to $I_A$. Coupling transistor 340 between $M_B$ and $V_{SS}$ ensures that current $I_B$ will always be greater than current $I_A$ prior to programming, and therefore output 220 is guaranteed to be logic 0.

In a preferred embodiment, input 250 is set to high during programming. Input 250 controls the gate of transistor $M_{rw}$. In one embodiment, transistor $M_{rw}$ is a wide (5 micron) and short (0.6 micron) device that acts as a switch for connecting the drain of $M_A$ to $V_{SS}$. Thus, setting input 250 to high will cause the drain voltage of transistor $M_A$ to be approximately $V_{SS}$. This creates a large voltage drop across $M_A$, which in turn causes additional charge to be deposited on the floating gate of transistor $M_A$. This additional charge on the gate of transistor $M_A$ increases its gate-source voltage and consequently increases $I_A$ to become greater $I_B$. Moreover, because transistor $M_A$ is now operating in the saturation region, the capacitive coupling from transistors 330 and 340 have less of an impact on the relative currents $I_A$ and $I_B$. Latching circuit 210 senses that $I_A$ is now greater than $I_B$ and changes its output 220 accordingly to be logic 1, indicating that the part has now been programmed.

Thus, embodiments of the present invention allow for a known default state of an EPROM program status bit to be held after final anneal. Consequently, an observer may determine with certainty if the EPROM has been programmed by simply reading the value at the program status bit. This is opposed to a balanced differential EPROM device whose initial states has an equal probability of being logic 1 as it does being logic 0.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A circuit for indicating the program status of an EPROM comprising:
    a first transistor coupled to a first voltage potential;
    a second transistor coupled to the first voltage potential;
    a latching circuit coupled to the first transistor and the second transistor, wherein the latching circuit outputs a first output value when the current through the first transistor is greater than the current through the second transistor and outputs a second output value when the current through the first transistor is less than the current through the second transistor;
    a first capacitive element coupled between a gate of the first transistor and a third voltage potential, the capacitance of the first capacitive element being such that the output of the latching circuit is always a first digital state prior to programming the EPROM and a second digital state after programming the EPROM, wherein the first digital state indicates that the EPROM has not been programmed and the second digital state indicates that the EPROM has been programmed; and
    a second capacitive element coupled between a gate of the second transistor and a fourth voltage potential, the capacitance of the second capacitive element being such that the output of the latching circuit is always a first digital state prior to programming the EPROM and a second digital state after programming the EPROM.

2. The circuit as recited in claim 1 further comprising a programming circuit coupled to the first transistor, wherein the programming circuit changes the digital state of the first transistor upon receiving a programming signal.

3. The circuit as recited in claim 1 further comprising a programming circuit coupled to the second transistor, wherein the programming circuit changes the digital state of the second transistor upon receiving a programming signal.

4. The circuit as recited in claim 1 wherein said capacitive element comprises a capacitor.

5. The circuit as recited in claim 1 wherein said capacitive element comprises a third transistor.

6. An EPROM comprising:
    a first transistor coupled to a first voltage potential;
    a second transistor coupled to the first voltage potential;
    a latching circuit coupled to the first transistor and the second transistor, wherein the latching circuit outputs a first output value when the current through the first transistor is greater than the current through the second transistor and outputs a second output value when the current through the first transistor is less than the current through the second transistor;
    a first capacitive element coupled between a gate of the first transistor and a third voltage potential, the capacitance of the first capacitive element being such that the output of the latching circuit is always a first digital state prior to programming the EPROM and a second digital state after programming the EPROM; and
    a second capacitive element coupled between a gate of the second transistor and a fourth voltage potential, the capacitance of the second capacitive element being such that the output of the latching circuit is always a first digital state prior to programming the EPROM and a second digital state after programming the EPROM.

7. The circuit as recited in claim 6 further comprising a programming circuit coupled to the first transistor, wherein the programming circuit changes the digital state of the first transistor upon receiving a programming signal.

8. The circuit as recited in claim 6 further comprising a programming circuit coupled to the second transistor, wherein the programming circuit changes the digital state of the second transistor upon receiving a programming signal.

9. The circuit as recited in claim 6 wherein the capacitive element comprises a capacitor.

10. The circuit as recited in claim 6 wherein the capacitive element comprises a third transistor.

11. A method for signaling the program status of an EPROM, the method comprising:
    outputting a pre-defined first digital state at a program status bit prior to programming, wherein the first digital state indicates that the EPROM has not been programmed;
    receiving a programming signal at an input of the EPROM;
    outputting a pre-defined second digital state at the program status bit in response to the programming signal being asserted at the input of the EPROM, wherein the second digital state indicates that the ERPOM has been programmed;
    capacitively coupling a gate of a first transistor of the EPROM to a first voltage potential such that the EPROM is guaranteed to output the first digital state at the program status bit prior to programming and the second digital stage after programming; and
    capacitively coupling a gate of the second transistor to a second voltage potential such that the EPROM is guaranteed to output the first digital state at the program status bit prior to programming and the second digital stage after programming.

12. The method as recited in claim 11 wherein the capacitive coupling is achieved by a capacitor.

13. The method as recited in claim 11 wherein the capacitive coupling is achieved by a third transistor.

* * * * *